United States Patent [19]

Wang et al.

[11] Patent Number: 5,225,832
[45] Date of Patent: Jul. 6, 1993

[54] HIGH SPEED VARIABLE LENGTH DECODER

[75] Inventors: Jinn-Shyan Wang, Hsin Chu; Yung-Jung Jan, Keelung, both of Taiwan

[73] Assignee: Industrial Technology Research Institute, Hsin Chu, Taiwan

[21] Appl. No.: 836,076

[22] Filed: Feb. 13, 1992

[51] Int. Cl.$^5$ ............................................. H03M 7/40
[52] U.S. Cl. ........................................ 341/67; 341/59
[58] Field of Search ........................ 341/67, 59, 65, 79, 341/95, 106, 107; 358/261.1, 261.2, 261.4

[56] References Cited

U.S. PATENT DOCUMENTS

| | | | |
|---|---|---|---|
| 4,177,456 | 12/1979 | Fukinuki et al. | 341/67 |
| 4,853,696 | 8/1989 | Mukherjee | 341/65 |
| 5,032,838 | 7/1991 | Murayama et al. | 341/67 |
| 5,055,841 | 10/1991 | Cordell | 341/67 |

OTHER PUBLICATIONS

A. Murkherjee & N. Ranganathan, "Efficient VLSI Designs for Data Transformation of Tree-Based Codes", IEEE, Trans. on Cir. & Sys., Mar. 1991, pp. 306-314.
N. S. Jayant & P. Noll, "Digital Coding of Waveforms: Principles & Applications to Speech & Video", Prentice-Hall Signal Processing Series, Ch. 10.2-4. (1984).
S.-M. Le, M.-T. Sun et al, "VLSI Implementation of an Entropy Coder and Decoder for Advanced TV Applications", IEEE, CH2868-8/90/0000, 1990, pp. 3030-3033.
T. Lynch, "Data Compression: Technique & Applications", 1985, pp. 13-16, 44-57.
A. Netravali & B. Haskell, "Digital Pictures: Representation & Compression", Plenum Press, New York, pp. 147-181. (1988).
M. Sung & S. Lei, "A Parallel Variable-Length-Code Decoder for Advanced Television Applications", 3rd Int'l Workshop on HDTV, Aug., 1989.

Primary Examiner—A. D. Pellinen
Assistant Examiner—Brian K. Young
Attorney, Agent, or Firm—Marmorek, Guttman & Rubenstein

[57] ABSTRACT

A high speed variable length decoder can decode more than one code word in one cycle. A PLA used in the decoder includes extra product lines and extra output lines in order to detect and decode two successive short length code words in one cycle. When two short length code words are detected, a corresponding extra product line is activated and the two code words are decoded in the same cycle using an extra output line. For a digital video compression system, a significant speed-up in the variable length decoder can be achieved by the invention.

13 Claims, 7 Drawing Sheets

FIG. 4

| SYMBOL | 0 | 1 | 2 | 3 | 4 | 5 |
|---|---|---|---|---|---|---|
| BINARY REPRESENTATION | 000 | 001 | 010 | 011 | 100 | 101 |
| PROBABILITY | 0.5 | 0.15 | 0.1 | 0.1 | 0.1 | 0.05 |
| CODE WORD | 0 | 100 | 101 | 110 | 1110 | 1111 |

FIG. 7

| | AMPLITUDE | | | | | | | | | | | | | | | |
|---|---|---|---|---|---|---|---|---|---|---|---|---|---|---|---|---|
| RUN LENGTH | 1 | 2 | 3 | 4 | 5 | 6 | 7 | 8 | 9 | 10 | 11 | 12 | 13 | 14 | 15 | 16 |
| 0 | 2 | 3 | 5 | 5 | 6 | 7 | 8 | 8 | 9 | 9 | 9 | 10 | 10 | 11 | 11 | 11 |
| 1 | 4 | 5 | 7 | 8 | 9 | 10 | 10 | 11 | 12 | 12 | 13 | 14 | 14 | 15 | 15 | 16 |
| 2 | 4 | 7 | 8 | 10 | 11 | 12 | 13 | 14 | 15 | 16 | 16 | 16 | 18 | 18 | 19 | 19 |
| 3 | 5 | 8 | 10 | 11 | 13 | 14 | 15 | 16 | 17 | 18 | 18 | 19 | 19 | 19 | 21 | 21 |
| 4 | 6 | 9 | 12 | 14 | 15 | 17 | 18 | 18 | 20 | 21 | 20 | 22 | 28 | 29 | 29 | 29 |
| 5 | 7 | 10 | 13 | 16 | 18 | 19 | 22 | 21 | 21 | 29 | 29 | 29 | 29 | 29 | 29 | 29 |
| 6 | 7 | 11 | 14 | 17 | 18 | 19 | 19 | 17 | 20 | 21 | 28 | 28 | 28 | 28 | 28 | 28 |
| 7 | 8 | 12 | 16 | 18 | 19 | 22 | 20 | 28 | 28 | 28 | 28 | 28 | 28 | 28 | 28 | 28 |
| 8 | 9 | 14 | 17 | 21 | 28 | 28 | 28 | 28 | 28 | 28 | 28 | 28 | 28 | 28 | 28 | 28 |
| 9 | 9 | 15 | 19 | 28 | 28 | 28 | 28 | 28 | 28 | 28 | 28 | 28 | 28 | 28 | 28 | 28 |
| 10 | 10 | 16 | 20 | 28 | 28 | 28 | 28 | 28 | 28 | 28 | 28 | 28 | 28 | 28 | 28 | 28 |
| 11 | 11 | 18 | 28 | 22 | 28 | 28 | 28 | 28 | 28 | 28 | 28 | 28 | 28 | 28 | 28 | 28 |
| 12 | 11 | 17 | 28 | 22 | 28 | 28 | 28 | 28 | 28 | 28 | 28 | 28 | 28 | 28 | 28 | 28 |
| 13 | 11 | 17 | 28 | 22 | 28 | 28 | 28 | 28 | 28 | 28 | 28 | 28 | 28 | 28 | 28 | 28 |
| 14 | 12 | 20 | 28 | 22 | 28 | 28 | 28 | 28 | 28 | 28 | 28 | 28 | 28 | 28 | 28 | 28 |
| 15 | 13 | 20 | 28 | 22 | 28 | 28 | 28 | 28 | 28 | 28 | 28 | 28 | 28 | 28 | 28 | 28 |

HIGH SPEED VARIABLE LENGTH DECODER

RELATED APPLICATION

A related application entitled "HDTV Decoder" has been filed for the inventors hereof on even date herewith and is assigned to the assignee hereof. The contents of this related application, which bears Ser. No. 07/836,062, are incorporated herein by reference.

FIELD OF THE INVENTION

The present invention relates to a high speed variable length decoder which can decode more than one code word in one cycle. The invention is especially useful in digital video or image compression systems where the data rate is very high.

BACKGROUND OF THE INVENTION

Data compression is the reduction of redundancy in data to decrease data communication costs and data storage requirements. Data compression is especially important in digital video processing systems where it is important to minimize the bandwidth required to transmit video images and minimize the memory requirements for storing video images.

Run length coding (RLC) and variable length coding (VLC) are two widely adopted techniques for lossless data compression.

One example of a variable length code is the Huffman code. The operation of the Huffman code may be understood in connection with FIG 1. In particular, FIG. 1 illustrates a Huffman tree. The tree is constructed for a set of seven characters A, B, C, D, E, F and G with the corresponding probabilities of occurrence of these characters being 0.1, 0.1, 0.1, 0 3, 0.1, 0.1, and 0.2 respectively. These probabilities are written in circles corresponding to the leaf nodes of FIG. 1. A circle denoting an internal node in the tree of FIG. 1 contains the sum of the probabilities of its child nodes.

The Huffman code word for a character is the sequence of 0's and 1's in the unique path from the root of the tree to the leaf node representing the character. For example, the code word for A is 000 and the code word for D is 01. To compress the character string DAF, a Huffman encoder concatenates the code words for the three characters to produce the binary string 0100000.

In general, in a Huffman code, characters with a higher probability of occurrence have shorter code words and characters with a lower probability of occurrence have longer code words.

In digital video systems, the data rate is usually very high. The primary requirement for a variable length encoder or decoder used in such a system is high speed. To achieve high speed coding and decoding, it is desirable to use parallel processing. Because the inputs of a variable length encoder are fixed length data words representing character symbols, it is easy to partition them for parallel encoding.

For a variable length decoder, the situation is quite different. Because the input data are variable length coded, it is not easy to recognize the boundaries between successive input code words. Thus, the input data cannot be easily partitioned for the utilization of parallel processing. Because of this constraint, the easiest way to decode the input data is bit by bit, using what is known as a bit serial decoder.

An example of a bit serial decoder is disclosed in U.S. Pat. No. 4,853,696 which issued Aug. 1, 1989 to A. Mukherjee and in A. Mukherjee et al, "Efficient VLSI Designs for Data Transformation of Tree-Based Codes", IEEE Transactions on Circuits and Systems, Vol. 38, No. 3, March 1991, pp. 306-314. This bit serial decoder is also implemented through use of the Huffman tree. For example, to decompose the binary string stated above, the decoder moves down the tree while processing the binary string from left to right. Thus, the first 0 causes the decoder to branch to the right child of the root. The following 1 causes the decoder to branch to the external node representing the particular character D. The decoding speed of a bit serial decoder is one bit/cycle. In the case of a bit serial decoder, the input bit rate is fixed, while the output bit rate is variable.

The bit serial decoder cannot meet the high data rate requirement of video systems because its decoding speed is only one bit/cycle. Therefore some kind of parallel processing technique is necessary for a hardware implementation of a variable length decoder. A simple technique is to partition the data to be encoded by the encoder into segments and insert a unique word between each adjacent segment. A unique word means a word that cannot be generated by any combination of the code words. At the decoder, the unique word is utilized to detect the boundary between adjacent segments. Then, several variable length decoders can be utilized to decode several segments at the same time.

Of course, high parallelism can be achieved via this architecture. However, there are several significant disadvantages. First, a great deal of extra hardware is required. Second, a decoder of this type can only be utilized with an encoder which transmits the unique word. In addition, the insertion of the unique word will degrade the compression efficiency.

The bottleneck of a variable length decoder is that the length of an incoming code word is not known in advance. However, once the length of an incoming code word is known, the decoder can begin to decode the next code.

Based on the above concept, a parallel structure for a variable length decoder was proposed by J. W. Peake in "Decompaction", IBM Technical Disclosure Bulletin, Vol. 26, No. 9, pp. 4794-4797, February, 1984. A block diagram of this variable length decoder is illustrated in FIG. 2.

The decoder 10 of FIG. 2 includes an input buffer 14 for storing incoming compressed data 12. The input buffer 14 comprises two latches L1 and L2. The number of bit positions in each of the two latches is equal to the longest code word utilized in the system (e.g. P bits) so the two latches together have a total number of bit positions equal to twice the longest codeword in the system (e.g. 2P bits).

The decoder 10 of FIG. 2 also includes a barrel shifter 16. The barrel shift defines a window of length P in the two latches, which window has a variable location. The two latches of the input buffer are filled with incoming compressed data bits. Initially, the barrel shifter 16 defines a window which is coextensive with the first latch of the input of buffer. The P bits outputted by the barrel shifter 16 are applied to a length programmable logic array (PLA) 22 via lines 19. The bits outputted by the barrel shifter 16 are also applied to a decoder PLA 20 via lines 21. The length PLA 22 outputs via lines 23 the length of the first code to be decoded. The decoder PLA 20 outputs the corresponding decoded character symbol.

The length of the first code word is fed back via lines 23 to the barrel shifter 16. The window defined by the barrel shifter is then shifted a number of positions equal to the length of the first code word. If the first code word contains Q bits, the window defined by the barrel shifter is shifted so that the first Q bits from the first latch L1 ar eliminated from the window and the first Q bits from the second latch L2 are included in the window. Thus, after a decode operation, the number of undecoded bits in the window defined barrel shifter is always equal to the longest possible code word in the system which is P bits. The next code word is then decoded by applying the present bits in the barrel shifter to both the length PLA 20 and the decode PLA 22. When enough of the compressed data bits have been decoded so that the number of decoded bits equals or exceeds P, the contents of the second latch L2 are moved into the first latch L1 and new data bits are written into the second latch L2. The barrel shifter then defines a window which includes the bits now in the first latch which have not been decoded and enough bits from the second latch so that the window is equal to P bits. Again, the next code word is decoded by applying the present bits in the barrel shifter to both the length PLA and the decoder PLA.

The speed of the parallel decoder 10 of FIG. 2 is one code word per cycle. This is much faster than the one bit per cycle of the bit serial decoder discussed above. Moreover, the parallel decoder 10 of FIG. 2 does not require use of a unique word to separate the coded bit stream into segments.

A VLSI implementation of the parallel decoder 10 was presented at the 3rd International Workshop on HDTV, Italy, August 1989, entitled "A Parallel Variable Length Code Decoder for Advanced Television Applications".

In the decoder 10 of FIG. 2, both the length PLA 22 and Decoder PLA 20 have the same AND plane. Therefore, the two PLA's can be merged into one. FIG. 3 shows an example of such a single PLA. FIG. 4 is a table which sets forth the variable length code which can be decoded using the PLA of FIG. 3. As shown in FIG. 4, this code has six symbols with different probabilities of occurrence. The corresponding code words are variable length depending on the probability of occurrence of the symbol.

The PLA 30 of FIG. 3 comprises an AND-plane 32, a length OR-plane 34 and a decoder OR-plane 36. The AND plane 32 serves to detect the presence of a particular input code word on the input lines 38. The length OR-plane 34 stores a table which contains the length of each of the code words in FIG. 4. The decoder OR-plane 36 stores a table which contains the data symbol corresponding to each code word.

There is one product line 40 in the PLA 30 for each code word in the code of FIG. 4. The input bits are received on the input lines 38. The number of input lines 38 is equal in length to the longest code word in the system. There is one input line 38 for each position in the barrel shifter 16 of FIG. 2. The complement of each input bit on a line 38 is obtained by a corresponding inverter 39 so that each input bit and its complement appear on lines 41a and 41b, respectively.

The AND-plane 32 of the PLA 30 utilizes the AND-plane transistors 42 to perform a parallel matching on the input data present on the input lines 38. When a code word contained in the data on the input lines 38 is matched, the specific corresponding product line 40 is held high. This allows the OR-plane transistors 44, associated with the specific held high product line, to output, via the inverters 45, the code word length on the output lines 47. Similarly, when a product line 40 is held high, the OR plane transistors 54, associated with that product line, output the decoded code word via the inverters 56 on the output lines 57.

The bottleneck of the parallel decoder 10 of FIG. 2 is the loop formed by the length PLA 22 and the barrel shifter 16. For every cycle, only one code word can be decoded. If higher decoding speed is desired, two or more code words must be decoded in each cycle.

Accordingly, it is an object of the present invention to provide a variable length decoder which can decode more than one code word in a cycle. Specifically, it is an object of the present invention to modify the variable length decoder of FIG. 2 to decode more than one code in a cycle without substantially increasing the hardware complexity.

SUMMARY OF THE INVENTION

In accordance with an illustrative embodiment of the present invention, the PLA 30 of FIG. 3, utilized to implement the variable length decoder of FIG. 2, is modified to include one or more extra product lines and one or more extra output lines in the decoder OR-plane. Specifically, the PLA of FIG. 3 is modified to include extra product lines and extra output lines to detect and decode combinations of more than one successive code word in a cycle. The combinations of successive code words which are detected and decoded have a combined length which is less than or equal to the longest code word in the system.

Thus, the present invention focuses on high probability codes (i.e. codes with a short code length). The present invention decodes two code words in one cycle only for certain combinations of short length codes. In accordance with the present invention, two code words are not decoded in every cycle, but only in those cycles where certain predetermined combinations of short code words occur. In this case, the overhead for extra hardware is reasonable, while the coding speed can be increased significantly. In a cycle, where an appropriate combination of code words is not present in the input data bits, only one code word is decoded.

In a particular embodiment of the invention, consider a first group of code words labeled A and a second group of code words is labeled B. Two successive codes may be detected and decoded in accordance with the present invention if the first code belongs to group A and the second code belongs to group B. Groups A and B are determined by the condition that a code in group A when combined with a code in group B is not longer than the longest code word in the system.

In this case the probability P for decoding two words in one cycle is given by:

$$P = \text{(the summation of all the probabilities of the code words in group } A) \times \text{(the summation of all the probabilities of code words in group } B) \quad (1)$$

The number $N$ of extra product lines is given by:

$$N = \text{(The number of code words in group } A) * \text{(The number of code words in group } B) \quad (2)$$

-continued

The number of extra output lines is given by:

$$\log_2 (\text{The number of elements in group } B + 1) \quad (3)$$

If this result is not an integer, it should be rounded to the nearest greater integer.

From the foregoing equations, it can be seen that the present invention is most suitable to those systems which have very short code words and in which the probability distribution of the code words is uneven. In such a case, the speedup in decoding is high while the amount of extra hardware required is quite reasonable.

In contrast, in a system which decodes two code words in every cycle, the number of product lines needed in the PLA would be equal to the square of the number of symbols. For a coding system with more than thirty symbols, this is not only wasteful, but physically impossible as well.

BRIEF DESCRIPTION OF THE DRAWING

FIG. 4 illustrates a variable length code which is decoded using the PLA of FIG. 3.

FIG. 7 is a bit allocation table of a two-dimensional Huffman code.

DETAILED DESCRIPTION OF THE INVENTION

Figure 1:
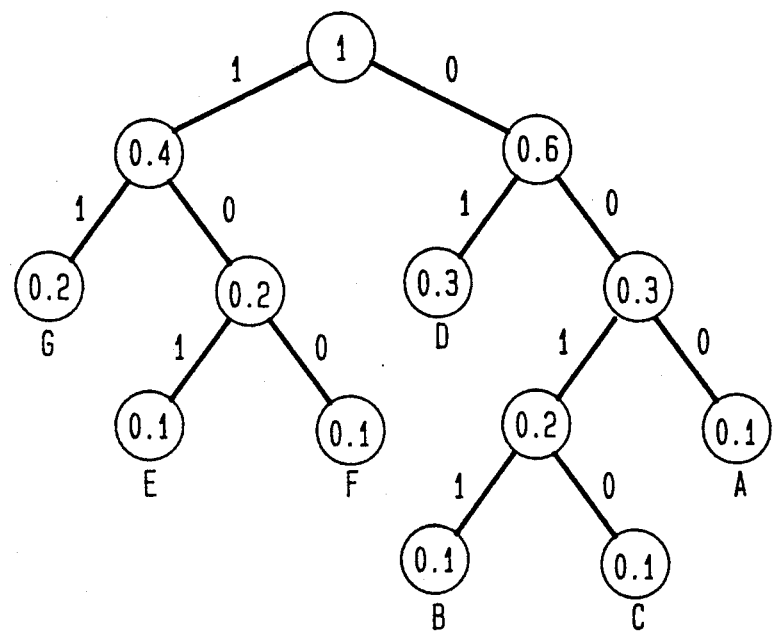
FIG. 1 illustrates a Huffman tree.
Figure 2:
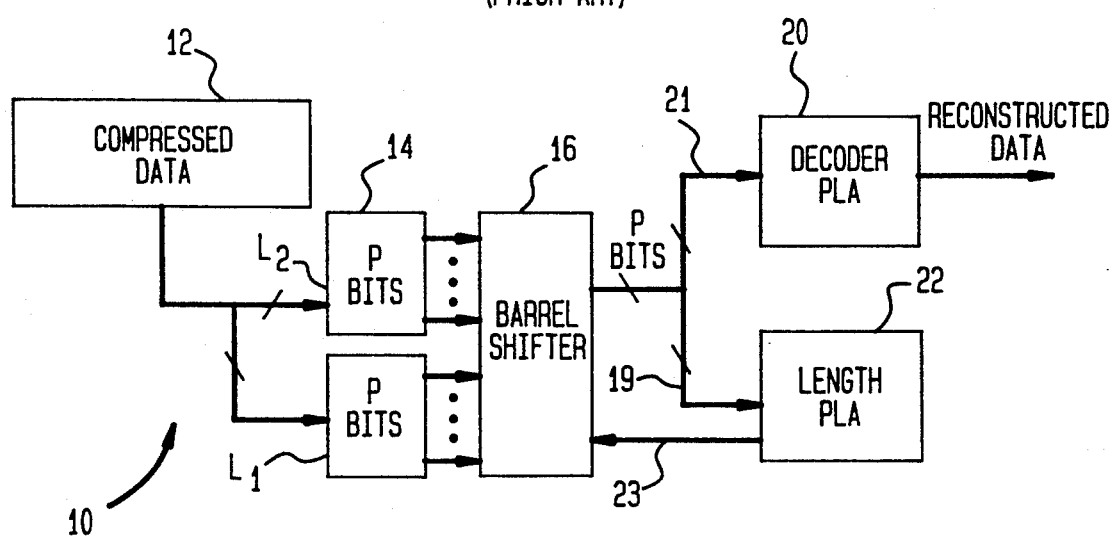
FIG. 2 illustrates a parallel variable length decoder.
Figure 3:
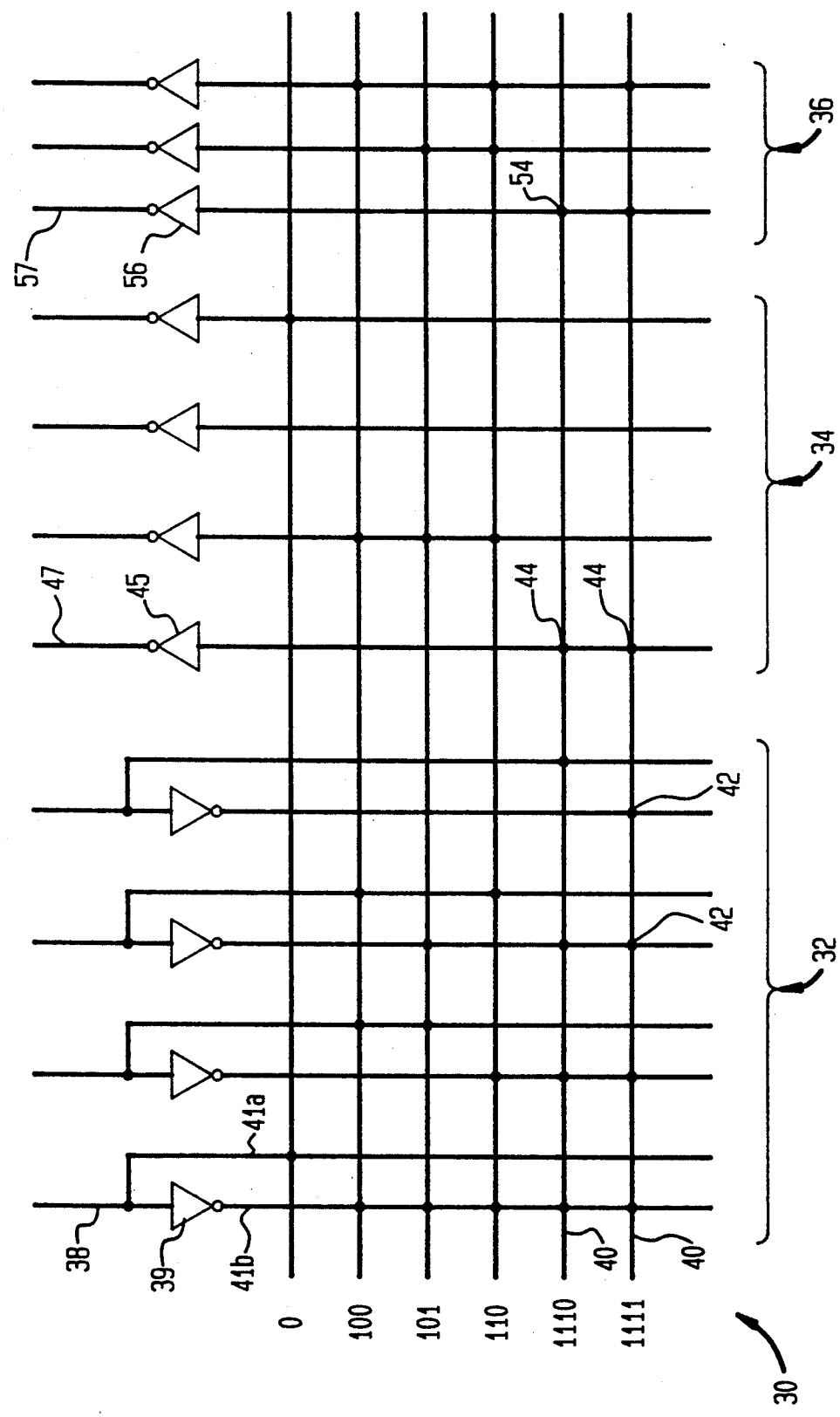
FIG. 3 illustrates a PLA for use in the decoder of FIG. 2.
Figure 5:
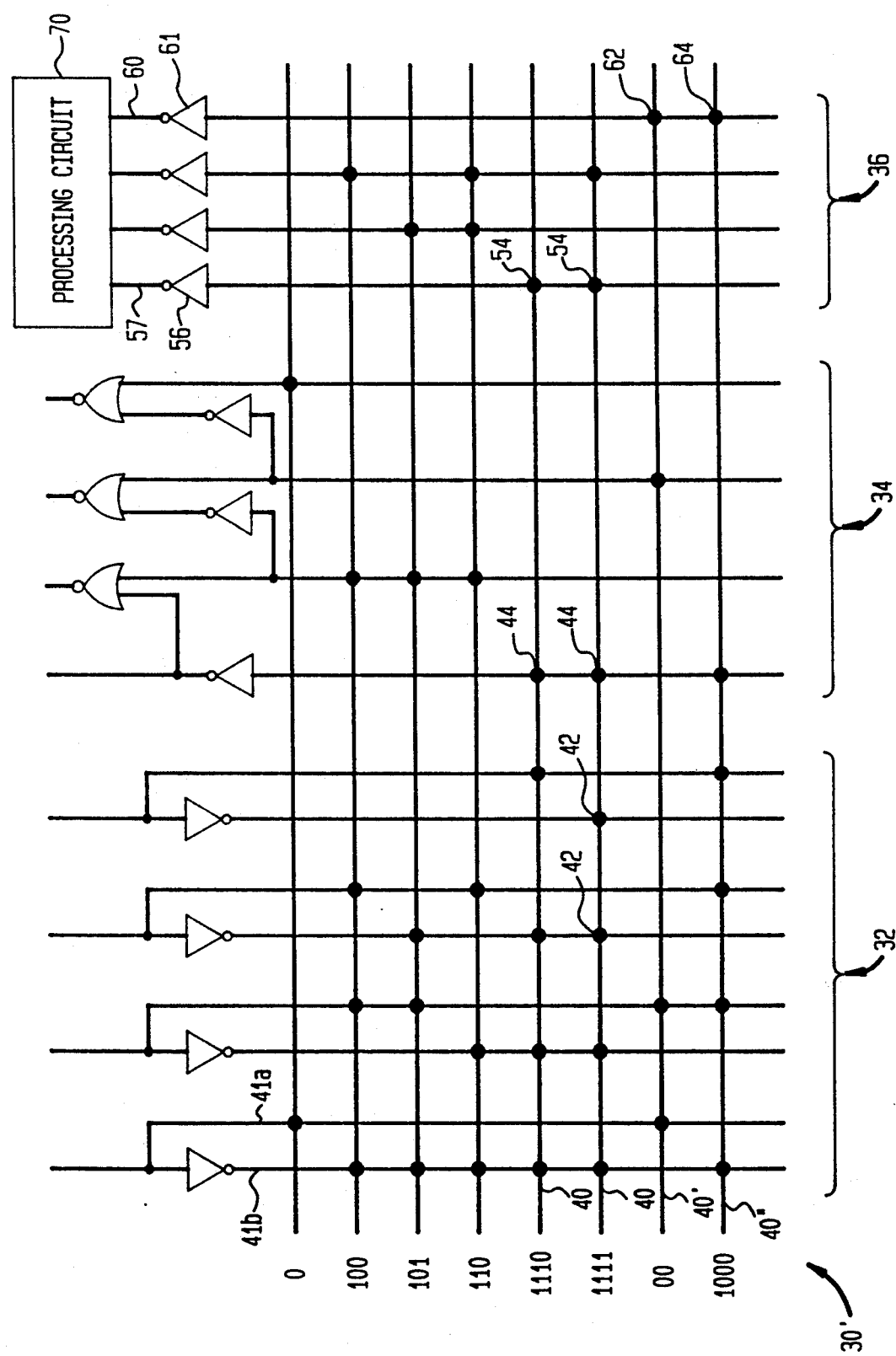
FIG. 5 and FIG. 6 illustrate PLA's for modifying the decoder of FIG. 2 for decoding more than one code word in a cycle, in accordance with the present invention.

An example of a PLA which can be utilized with the decoder 10 of FIG. 2 to decode more than one code word in some cycles is illustrated in FIG. 5.

For the code of FIG. 4, if the incoming code word is 0 or 100 and the next code word is 0, the two successive code words can be decoded in one cycle using the PLA 30' of FIG. 5. Thus, in this example, Group A comprises the code words 0 and 100 and group B comprises the code word 0. In other words, when the incoming bit stream to the decoder is 00 or 1000, the length OR-plane 34 would output the total length of the two codes.

To accomplish this, the PLA 30' of FIG. 5 includes two extra product lines labeled 40' and 40" for detecting the presence of the code word combinations 00 and 1000, respectively. As indicated above in equation (2), the number of extra product lines is determined by multiplying the number of elements in group A times the number of elements in group B.

The PLA 30' also includes the extra output line 60 and associated inverter 61 in the decoder OR-plane 36. As indicated above in equation (3), the number of extra output lines is given by log$_2$ (the number of elements in group B+1)=log$_2$(1+1)=1. The extra output line 60 is activated by the product line 40' via the OR-plane transistor 62 when the combination 00 is detected. The extra output line 60 is also activated by the product line 40" via the OR-plane transistor 64 when the combination 1000 is detected. Thus, in the illustrative PLA 30' of FIG. 5, when the output line 60 is low, it indicates that only one code word has been decoded. On the other hand when the extra output line 60 is high, it indicates that a combination of one of the code words 0 or 100 and the code word 0 has been detected. The binary representation of the decoded first code word (0 or 100) appears on the output lines 57. When the extra output 60 is high, it means that the binary representation of the decoded second code word, i.e. 000, the binary representation of 0, must be inserted after the binary representation of the decoded first code word on the lines 57. This can be accomplished using the processor circuit 70 of FIG. 5. Because the output of the modified PLA 30' of FIG. 5 is fixed length, the processor circuit 70 does not become a bottleneck of the decoder.

The PLA 30' outputs the length of the decoded code word or code words from the length OR-plane 34. The length is outputted via lines 47 through use of the inverters 45 and NOR gates 46. The purpose of the NOR gates 46 is to control the output of the length OR-plane 34 so that if two code words are decoded in one cycle, the original length output of the first code word will be masked while the total length of these two code words will be outputted.

The foregoing example can be summarized as follows. First and second code words can be decoded in one cycle if the first code word belongs to group A which is comprised of 0 and 100 and the second code word belongs to group B which is comprised of 0. (It can be seen from FIG. 4 that the combination of either code word from group A with the code word of group B has a length less than or equal to the length of the longest code word in the system).

The probability P that two codes will be decoded in a cycle is $$\begin{aligned} P &= (\text{Sum of the probabilities of the code} \\ &\quad \text{words in group } A) \times (\text{Sum of the} \\ &\quad \text{probabilities of the code words in group } B) = \\ &\quad (0.05 + 0.15)(0.5) = .325. \end{aligned}$$

Thus in approximately one out of every three cycles two code words will be decoded. This results in a significant increase in the speed of the system for which the trade-off is a relatively small increase in the hardware.

Figure 6:
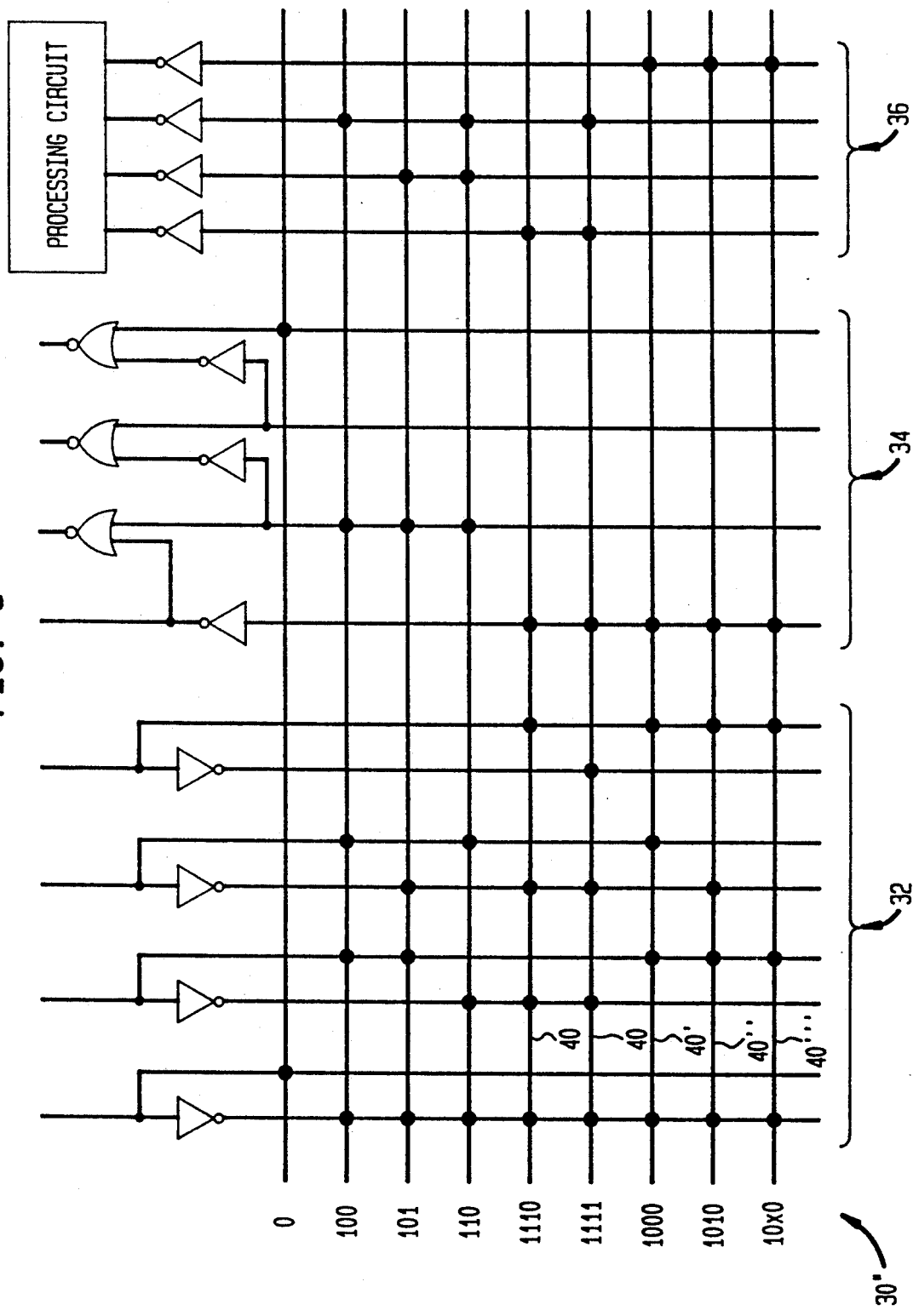

Logic minimization techniques may be utilized to reduce the number of extra product lines in a PLA to a number below that given by equation (2) above. For example, if the elements in Group A are the code words 100 and 101 (see FIG. 4) and the element in group B is the code word 0 (see FIG. 4), then a PLA for use in the decoder is illustrated in FIG. 6. In particular, the PLA 30" of FIG. 6 can be implemented with two extra product lines 40' and 40" corresponding to the combinations 1000 and 1010 or one extra product line 40''' corresponding to 10×0 where x is a "don't care". The reason that the two combinations can be detected using a single product line is that the OR-plane parts of the two product lines 40' and 40" are the same. In short, logic minimization techniques can substantially reduce the number of extra product lines required in PLA's in accordance with the present invention.

In modern video or still image transmission or processing systems, variable length coding (VLC) is utilized in combination with the discrete cosine transform (DCT), motion compensation, and runlength coding (RLC). The coefficients of the DCT are quantized so that there is a high probability for the occurrence of zeroes. Then, the RLC is utilized to represent a stream of continuous zeroes by its length which can greatly reduce the data rate. Being the last stage of the encoding process, the VLC accepts data from the RLC for further compression.

FIG. 7 is an example of a bit allocation table of a two-dimensional Huffman code for the DCT coefficients of an 8×8 block of pixels from an image. The coefficients of every 8×8 block are zig-zag scanned before Huffman encoding. Because a large portion of the quantized DCT coefficients are zeroes, only non-zero DCT coefficients are Huffman coded. That is, every Huffman code word contains two kinds of information: the AMPLITUDE represents the amplitude of a non-zero coefficient, and the RUNLENGTH represents the runlength of the zeroes preceding this non-zero coefficient. The entries of the table of FIG. 7 represent the number of bits assigned to the corresponding Huffman code words. It does not include a sign bit which must be included with each code word. For example, the entry corresponding to AMPLITUDE 2 and RUNLENGTH 6 is 11. This means that DCT coefficients of six successive zeroes followed by a 2 (or −2) are encoded into an 11 bit Huffman code word.

In addition to the 256 code words contained in the table of FIG. 7, there is a special two-bit code word called end-of-block which is used to represent all the zeroes at the end of a DCT block. Another special code word is used when the amplitude or runlength is beyond the range of the bit allocation table. Thus, a conventional PLA used to implement a variable length decoder with such a code table requires 258 product lines.

Consider the following example which utilizes the present invention.

The probability of an n bit code word is $2^{-n}$.

Group A contains all code words with a length less than or equal to five bits for a total of nine elements.

Group B contains all code words with a length less than or equal to three bits for a total of three elements.

The present invention can be utilized to modify a PLA which implements a variable length decoder so that combinations of code words containing one code word from Group A and one code word from Group B can be simultaneously detected and decoded.

Note that all the elements of Group A except the end-of-block code word have to include a sign bit. Therefore according to equation (2) above, the number of extra product lines needed is:

$$(1+(8*2))*3=51$$

Applying logic minimization to the extra product lines, the product lines corresponding to the code words of length 5 in group A may be reduced from 24 to 6. The product lines corresponding to the code words of length 4 in group A may be reduced from 12 to 6. Thus, the total extra product lines may be reduced from 51 to 27.

In accordance with equation (3) above, the number of extra output lines needed is:

$$\log_2(3+1)=2$$

In accordance with equations (1) above, the probability of decoding two codes in one cycle is:

$$(2*2^{-2}+2^{-3}+2*2^{-4}+4*2^{-5})(2*2^{-2}+2^{-3})=0.5\text{-}47.$$

Thus, in more than half the decoding cycles, two code words are detected and decoded. Therefore, the present invention is very suitable for high speed video or still image applications.

One advantage which can be realized by the high speed parallel VLC decoder of the present invention can be understood from FIGS. 8A, 8B, 9A, 9B.

As indicated above, an HDTV signal may be coded by first obtaining the Discrete Cosine Transform (DCT) of a block of pixels such as 8×8 blocks of pixels. The DCT coefficients may then be zigzag scanned, runlength coded and then variable length coded using, for example, a Huffman code. A decoder for an HDTV signal coded in this manner includes a variable length decoder (VLD) a run-length decoder (RLD), and a processor applying the inverse DCT.

In the HDTV decoder, inputted to the VLD are the variable length code words and outputted from the VLD are fixed length code words which contain two pieces of information: a run length of zeroes and the amplitude of a non-zero DCT coefficient. The runlength decoder receives the fixed length code words. After receiving an input code word, if the run length is not zero, the run length decoder will take (run length +1) clock cycles to output the corresponding run of zeroes followed by a non-zero DCT coefficient. Preferably, the run length decoder has an input with a burst rate of 70 MHz and an output which is synchronous to the system clock at a smooth rate of, for example, 70 MHz which is typical for an HDTV system. The circuit for obtaining the inverse DCT receives the DCT coefficients from a block of pixels and reconstructs the pixel block.

Figure 8A:
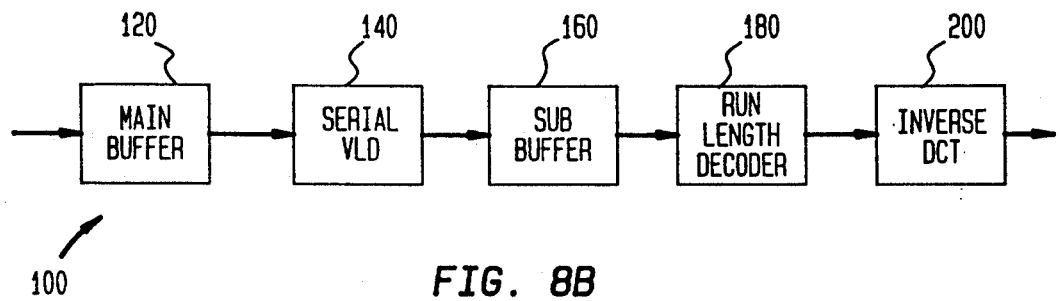
FIG. 8A illustrates a conventional HDTV decoder including a serial variable length decoder and a run-length decoder.

FIG. 8A illustrates a conventional HDTV decoder 100 wherein the coded HDTV signal is received at the main buffer 120. The variable length code words are then decoded into fixed length code words by the serial VLD 140. A sub-buffer 160 is utilized between the serial VLD 140 and the run length decoder 180 because the serial VLD 140 is quite slow and cannot achieve the burst input speed of 70 MHz of the run length decoder 180. The smooth output signal of the RLD 180 is connected to the circuit 200 for obtaining the inverse DCT.

Figure 8B:
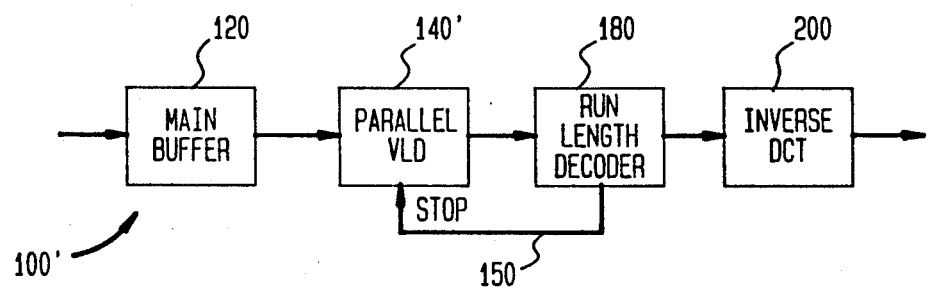
FIG. 8B illustrates a conventional HDTV decoder including a parallel variable, length decoder and a run-length decoder.

FIG. 8B illustrates the conventional HDTV decoder 100' in the case where a parallel VLD decoder is utilized rather than a serial VLD as was the case in FIG. 8A. Thus, instead of the serial VLD 140, the HDTV decoder 100, includes the parallel VLD 140'. The parallel VLD 140' is a conventional parallel VLD which decodes only one word per cycle. In this case, the runlength decoder 180 receives fixed-length code words directly from the parallel VLD 140, As indicated above, the output of the run-length decoder is synchronous to the system clock with a smooth output rate which is typical for an HDTV system such as 70 MHz. After receiving an input code word, whose run length is different from zero, the run length decoder takes (run length +1) cycles to output the corresponding run of zeroes followed by a run-zero DCT coefficient. In the meantime, the run decoder 180 outputs a STOP signal on line 150 to suspend the parallel VLD 140' until the last zero has been output. However, when the run length is equal to zero, it means that there are successive non-zero coefficients, the STOP signal would not be activated and the parallel VLD 140' has to operate at the burst input RLD which for example may be 70 MHz. On the hand, since there are a lot of zero DCT coefficients in a typical HDTV system, the average rate of the parallel VLD is only on the order of 5 MHz.

A problem with the HDTV decoder 100, of FIG. 8B is that a parallel VLD 140' which can operate at a burst rate of 70 MHz is very difficult to implement with currently available technology.

Figure 9A:
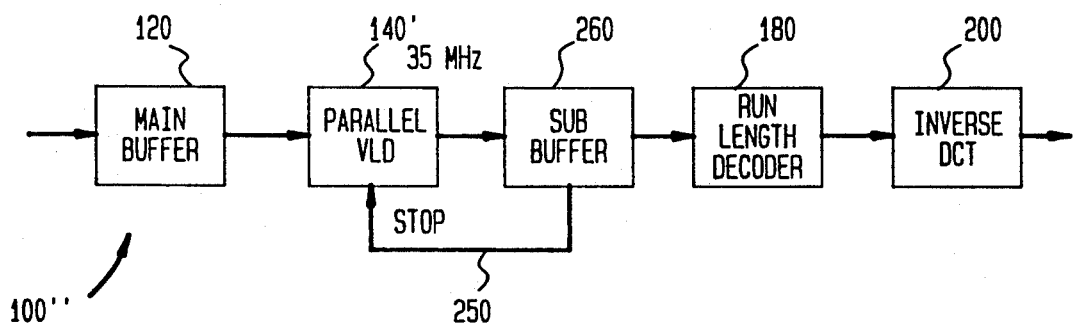
FIGS. 9A and 9B illustrate an HDTV decoder including a variable length decoder had a run-length decoder in accordance with the present invention.

This problem can be overcome in accordance with the present invention by utilizing the HDTV decoder 100" as shown in FIG. 9A. In the decoder 100', the sub-buffer 260 is inserted in between the parallel VLD 140' and the run length decoder 180. The purpose of the sub-buffer is to regulate the speed differential between the burst rate (e.g. 70 MHz) and average rate (e.g. 5 MHz) of the parallel VLD 140'. When the sub-buffer 260 is utilized, the parallel decoder 140' runs at an intermediate speed in between the average speed and the burst speed, for example 35 MHz. In this case, both the input and output of the VLD decoder run at the intermediate speed. In the HDTV decoder 100" of FIG. 9A, when the sub-buffer 260 is full, a STOP signal is transmitted to the parallel VLD, and operation of the VLD will be suspended. In the HDTV decoder 100,, of FIG. 9A, the higher the speed of the VLD 140', the smaller the required size of the sub-buffer 260.

The HDTV decoder 100" of FIG. 9A can be modified so that instead of a conventional parallel VLD 140' which decodes one code word per cycle, a modified parallel VLD which can decode more than one code word in a cycle is utilized. The modified HDTV decoder 100,,, which incorporates the modified parallel VLD 140" is illustrated in FIG. 9B.

Figure 9B:
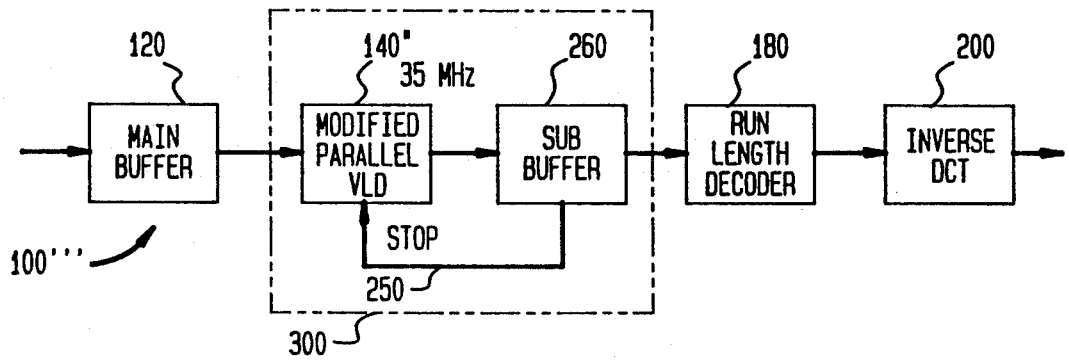

FIG. 9A and FIG. 9B illustrate the importance of a parallel VLD which can decode more than one variable length code word in a cycle in accordance with the present invention. In the HDTV decoder 100" of FIG. 9A, the conventional parallel VLD decoder 140' can decode only one word per cycle and the sub-buffer 260 has a size of 20-30 k bytes for the typical HDTV system. In contrast, in the HDTV decoder 100''' of FIG. 9B, the parallel VLD decoder 140' can decode more than one code word in same cycle in accordance with the present invention. In this case, the sub-buffer 260 need only have a capacity on the order 100 bytes for a typical HDTV system. Thus, in the HDTV decoder of FIG. 9A, the modified parallel VLD 140" and the small sub-buffer 260 can be integrated in a single integrated circuit 300.

Finally, the above-described embodiments of the invention are intended to be illustrative only. Numerous alternative embodiments may be devised by those skilled in the art without departing from the spirit and scope of the following claims.

We claim:

1. In a decoder for decoding an input bit stream composed of variable length code words which encode character symbols and whose probability of occurrence varies inversely with code word length, a programmable logic array comprising a plurality of product lines including one product line corresponding to each of said variable length code words and one or more additional product lines corresponding to one or more predetermined combinations of at least two of said variable length code words, the length of each of the combinations of variable length code words being less than or equal to the length of the longest of said variable length code words, a plurality of input lines equal in number at least to the longest of said variable length code words for receiving a set of input bits from said bit stream and for activating a specific product line corresponding to a single code word or combination of at least two code words contained in said set of said bits, and a plurality of output lines which are activated by said specific product line to output data for determining one or more symbols encoded by the single variable length code word or combination of at least two variable length code words corresponding to the specific product line, said decoder being capable of decoding in each of a sequence of decoding cycles one variable length code word or, simultaneously, a combination of at least two variable length code words.

2. The programmable logic array of claim 1 wherein said plurality of output lines includes a first set of output lines for outputting data representative of one of said symbols, and at least one extra output line which is activated when said specific product line corresponds to a combination of code words.

3. The programmable logic array of claim 1 wherein said programmable logic array comprises a second plurality of output lines activated by said specific product line for outputting data representative of the length of the code word or combinations of code words corresponding to the specific product line.

4. The programmable logic array of claim 1 wherein the number of additional product lines is less than or equal to the number of predetermined combinations of variable length code words.

5. A method for decoding a bit stream composed of a set of variable length code words whose probability of occurrence varies inversely with length comprising the steps of:

in each of a plurality of successive decoding cycles, applying to a programmable logic array a set of bits from said bit stream equal in length at least to the longest of said code words, in some of said decoding cycles, activating in said programmable logic array in response to the set of bits, a product line corresponding to one of said variable length code words and outputting from the programmable logic array data indicative of the length of said one code word and data representative of a symbol encoded by said one code word, and in the remainder of said decoding cycles, activating in response to the set of bits, a product line corresponding to a combination of more than one of said variable length code words, said combination having a length which is less than or equal to the length of the longest of said code words, and outputting from the programmable logic array data indicating the length of the combination of code words and data for determining a combination of symbols encoded by the combination of code words.

6. A decoder for decoding a bit stream composed of variable length code words each of which encodes a symbol, said decoder comprising a storage device, and a barrel shifter for applying to said storage device in each of a plurality of successive decoding cycles a set of bits from said bit stream, said storage device comprising first means for detecting in each set of bits one of said variable length code words or one of a plurality of predetermined combinations of more than one of said variable length code words, each predetermined combination having a length less than or equal to the longest of said variable length code words, second means for storing the lengths of said variable length code words and said combinations and for outputting data indicating the length of said one code word or said one combination of code words detected by said first means, and third means for storing data representative of the symbols encoded by said code words and said combinations and for outputting data representative of a symbol encoded by said one code word or representative of a combination of symbols encoded by said one combination detected by said first means, said decoder further comprising an input buffer connected to said barrel shifter for storing said bit stream, and feedback means for feeding the data outputted by said second means in each cycle back to said barrel shifter for shifting out of said barrel shifter a number of bits equal to the length of the detected word or combination and for shifting into said barrel shifter from said input buffer an equal number of bits.

7. A decoder for decoding a bit stream composed of variable length code words each of which encodes a symbol, said decoder comprising a storage device, and means for applying to said storage device in each of a plurality of successive decoding cycles a set of bits from said bit stream, said storage device comprising first means for detecting in each set of bits one of said variable length code words or one of a plurality of predetermined combinations of more than one of said variable length code words, each combination having a length less than the longest of said variable length code words, second means for storing the lengths of said variable length code words and said combinations and for outputting data indicating the length of said one code word or said one combination detected by said first means, and third means for storing data representative of the symbols encoded by said variable length code words and said combinations and for outputting data representative of a symbol encoded by said one code word or representative of a combination of symbols encoded by said one combination detected by said first means.

8. The decoder of claim 7 wherein said storage means comprises a programmable logic array and said first means is an AND-plane.

9. The decoder of claim 8 wherein said second means comprises an OR-plane of said programmable logic array.

10. The decoder of claim 9 wherein said third means comprises an additional OR-plane of said programmable logic array.

11. The decoder of claim 7 wherein in each cycle said third means outputs a symbol encoded by one of said code words and an indication when said first means detects a combination.

12. The decoder of claim 7 wherein said data outputted by said third means representative of a combination of code words detected by said first means comprises a first symbol encoded by one code word and an indication that a second symbol encoded by a second code word must be concatenated with the first symbol.

13. The decoder of claim 7 wherein an output of said decoder is connected to a sub-buffer and an output of said sub-buffer is connected to a run decoder.

* * * * *